United States Patent
Philipp et al.

(10) Patent No.: US 8,039,299 B2
(45) Date of Patent: Oct. 18, 2011

(54) METHOD FOR FABRICATING AN INTEGRATED CIRCUIT INCLUDING RESISTIVITY CHANGING MATERIAL HAVING A PLANARIZED SURFACE

(75) Inventors: Jan Boris Philipp, Peekskill, NY (US); Thomas Happ, Tarrytown, NY (US)

(73) Assignee: Qimonda AG, München (DE)

( * ) Notice: Subject to any disclaimer, the term of this patent is extended or adjusted under 35 U.S.C. 154(b) by 0 days.

(21) Appl. No.: 12/856,007

(22) Filed: Aug. 13, 2010

(65) Prior Publication Data

US 2010/0323493 A1 Dec. 23, 2010

Related U.S. Application Data

(62) Division of application No. 11/770,064, filed on Jun. 28, 2007, now Pat. No. 7,812,333.

(51) Int. Cl.
*H01L 21/06* (2006.01)

(52) U.S. Cl. ........ 438/102; 438/103; 438/131; 438/132; 257/E21.004; 257/E45.002

(58) Field of Classification Search .............. 438/54, 438/95, 102, 103, 131, 132, 139, 597, 602, 438/900; 257/2–4, 42, 467, E21.004, E31.029, 257/E31.03, E45.002; 365/148, 163
See application file for complete search history.

(56) References Cited

U.S. PATENT DOCUMENTS

| | | | | |
|---|---|---|---|---|
| 7,196,346 B2 * | 3/2007 | Okuno | ............... | 257/5 |
| 7,638,789 B2 * | 12/2009 | Peters | ............... | 257/4 |
| 7,667,219 B2 * | 2/2010 | Chang et al. | ............... | 257/4 |
| 2004/0175859 A1 * | 9/2004 | Campbell et al. | ............. | 438/102 |
| 2005/0029502 A1 * | 2/2005 | Hudgens | ............... | 257/4 |
| 2005/0110983 A1 * | 5/2005 | Jeong et al. | ............... | 356/148 |
| 2005/0142863 A1 * | 6/2005 | Spandr | ............... | 438/640 |
| 2005/0285096 A1 * | 12/2005 | Kozicki | ............... | 257/3 |
| 2006/0091492 A1 * | 5/2006 | Lee et al. | ............... | 257/467 |
| 2007/0096074 A1 * | 5/2007 | Asano et al. | ............... | 257/4 |
| 2007/0105267 A1 * | 5/2007 | Karpov et al. | ............... | 438/95 |
| 2008/0023685 A1 * | 1/2008 | Czubatyj et al. | ............... | 257/2 |
| 2008/0164453 A1 * | 7/2008 | Breitwisch et al. | ............. | 257/3 |
| 2008/0210921 A1 * | 9/2008 | Li et al. | ............... | 257/2 |

* cited by examiner

*Primary Examiner* — Matthew Landau
*Assistant Examiner* — Joseph C Nicely
(74) *Attorney, Agent, or Firm* — Coats & Bennett, P.L.L.C.

(57) ABSTRACT

An integrated circuit is fabricated by providing a preprocessed wafer including a first electrode, depositing a dielectric material over the preprocessed wafer, etching an opening in the dielectric material to expose a portion of the first electrode and depositing a first resistivity changing material over exposed portions of the etched dielectric material and the first electrode. The first resistivity changing material is planarized to expose the etched dielectric material. A second resistivity changing material is deposited over the etched dielectric material and the first resistivity changing material, and an electrode material is deposited over the second resistivity changing material.

12 Claims, 6 Drawing Sheets

METHOD FOR FABRICATING AN INTEGRATED CIRCUIT INCLUDING RESISTIVITY CHANGING MATERIAL HAVING A PLANARIZED SURFACE

PRIORITY CLAIM

This application is a divisional of, and claims priority to, U.S. application Ser. No. 11/770,064 filed 28 Jun. 2007, the content of which application is incorporated herein by reference in its entirety.

BACKGROUND

One type of memory is resistive memory. Resistive memory utilizes the resistance value of a memory element to store one or more bits of data. For example, a memory element programmed to have a high resistance value may represent a logic "1" data bit value and a memory element programmed to have a low resistance value may represent a logic "0" data bit value. Typically, the resistance value of the memory element is switched electrically by applying a voltage pulse or a current pulse to the memory element.

One type of resistive memory is phase change memory. Phase change memory uses a phase change material in the resistive memory element. The phase change material exhibits at least two different states. The states of the phase change material may be referred to as the amorphous state and the crystalline state, where the amorphous state involves a more disordered atomic structure and the crystalline state involves a more ordered lattice. The amorphous state usually exhibits higher resistivity than the crystalline state. Also, some phase change materials exhibit multiple crystalline states, e.g. a face-centered cubic (FCC) state and a hexagonal closest packing (HCP) state, which have different resistivities and may be used to store bits of data. In the following description, the amorphous state generally refers to the state having the higher resistivity and the crystalline state generally refers to the state having the lower resistivity.

Phase changes in the phase change materials may be induced reversibly. In this way, the memory may change from the amorphous state to the crystalline state and from the crystalline state to the amorphous state in response to temperature changes. The temperature changes of the phase change material may be achieved by driving current through the phase change material itself or by driving current through a resistive heater adjacent the phase change material. With both of these methods, controllable heating of the phase change material causes controllable phase change within the phase change material.

A phase change memory including a memory array having a plurality of memory cells that are made of phase change material may be programmed to store data utilizing the memory states of the phase change material. One way to read and write data in such a phase change memory device is to control a current and/or a voltage pulse that is applied to the phase change material. The temperature in the phase change material in each memory cell generally corresponds to the applied level of current and/or voltage to achieve the heating.

To achieve higher density phase change memories, a phase change memory cell can store multiple bits of data. Multi-bit storage in a phase change memory cell can be achieved by programming the phase change material to have intermediate resistance values or states, where the multi-bit or multilevel phase change memory cell can be written to more than two states. If the phase change memory cell is programmed to one of three different resistance levels, 1.5 bits of data per cell can be stored. If the phase change memory cell is programmed to one of four different resistance levels, two bits of data per cell can be stored, and so on. To program a phase change memory cell to an intermediate resistance value, the amount of crystalline material coexisting with amorphous material and hence the cell resistance is controlled via a suitable write strategy.

One type of phase change memory cell includes phase change material between a bottom electrode and a top electrode. A contact couples the top electrode to upper metallization layers. To reduce the power used to program the phase change material to an amorphous state, heat loss from the phase change material during programming should be minimized.

For these and other reasons, there is a need for the present invention.

SUMMARY

An embodiment of a method for fabricating an integrated circuit includes providing a preprocessed wafer including a first electrode, depositing a dielectric material over the preprocessed wafer, etching an opening in the dielectric material to expose a portion of the first electrode, and depositing a first resistivity changing material over exposed portions of the etched dielectric material and the first electrode. The first resistivity changing material is planarized to expose the etched dielectric material. A second resistivity changing material is deposited over the etched dielectric material and the first resistivity changing material, and an electrode material is deposited over the second resistivity changing material.

An embodiment of a method for fabricating a memory includes providing a preprocessed wafer including a first electrode, providing dielectric material having a pore exposing a portion of the first electrode over the preprocessed wafer, depositing a first phase change material over exposed portions of the dielectric material and the first electrode, and planarizing the first phase change material to expose the dielectric material. A second phase change material is deposited over the dielectric material and the first phase change material and an electrode material layer is deposited over the second phase change material. The electrode material layer and the second phase change material are etched to provide a second electrode and second phase change material contacting the first phase change material.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
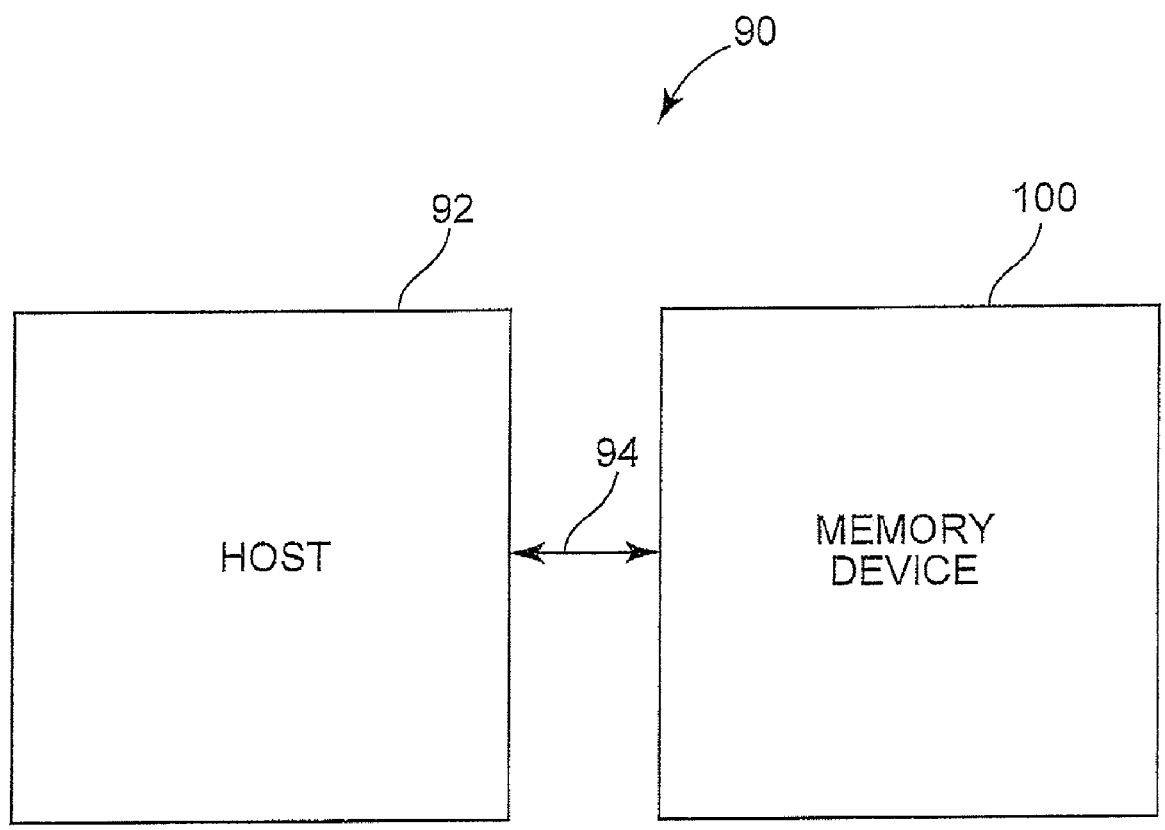
FIG. 1 is a block diagram illustrating one embodiment of a system.

FIG. 1 is a block diagram illustrating one embodiment of a system 90. System 90 includes a host 92 and a memory device 100. Host 92 is communicatively coupled to memory device 100 through communication link 94. Host 92 includes a computer (e.g., desktop, laptop, handheld), portable electronic device (e.g., cellular phone, personal digital assistant (PDA), MP3 player, video player, digital camera), or any other suitable device that uses memory. Memory device 100 provides memory for host 92. In one embodiment, memory device 100 includes a phase change memory device or other suitable resistive or resistivity changing material memory device.

Figure 2:
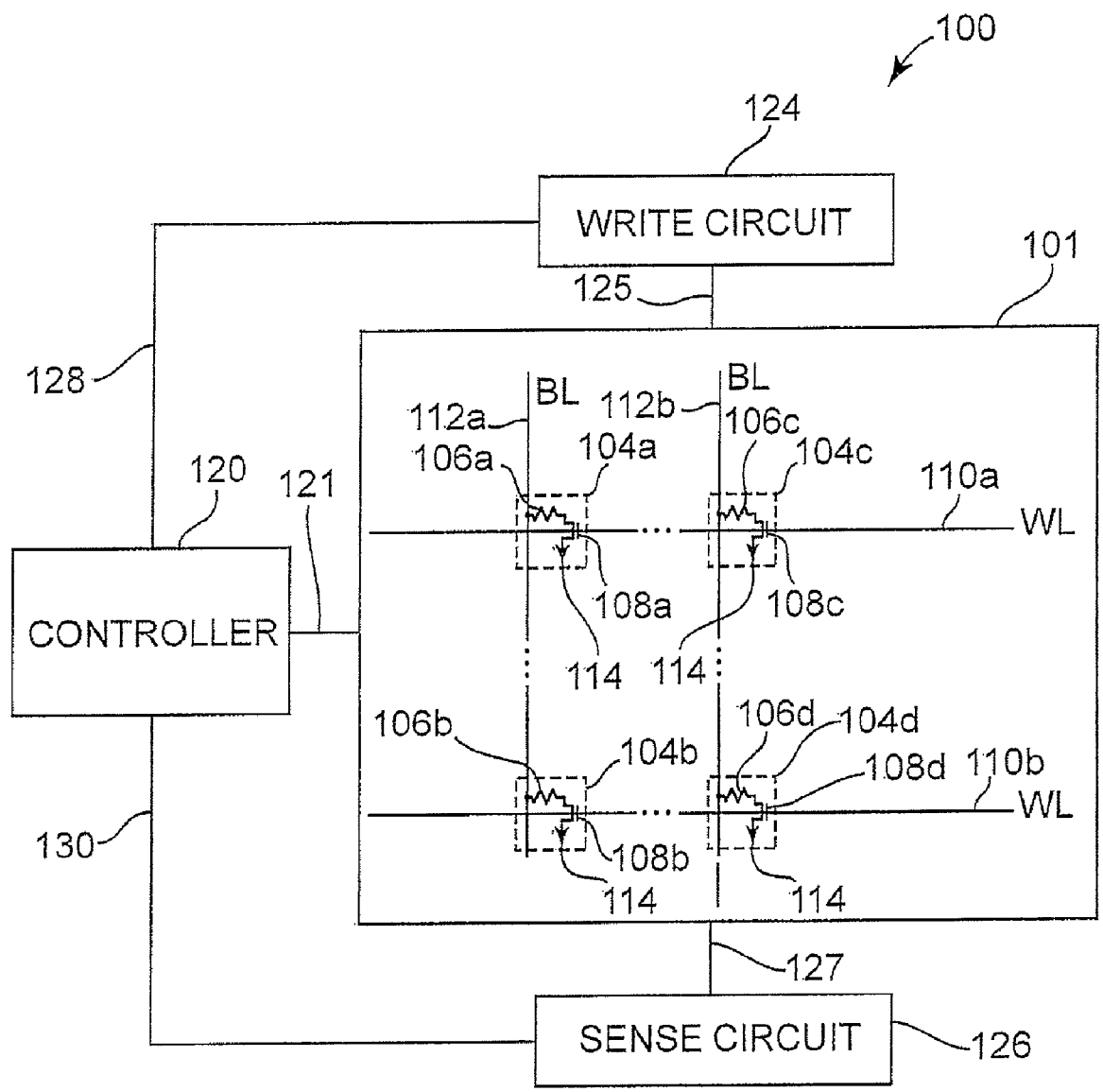
FIG. 2 is a diagram illustrating one embodiment of a memory device.

FIG. 2 is a diagram illustrating one embodiment of memory device 100. In one embodiment, memory device 100 is an integrated circuit or part of an integrated circuit. Memory device 100 includes write circuit 124, controller 120, memory array 101, and sense circuit 126. Memory array 101 includes a plurality of phase change memory cells 104a-104d (collectively referred to as phase change memory cells 104), a plurality of bit lines (BLs) 112a-112b (collectively referred to as bit lines 112), and a plurality of word lines (WLs) 110a-110b (collectively referred to as word lines 110). In one embodiment, phase change memory cells 104a-104d are arranged in rows and columns.

Each phase change memory cell 104 includes at least two phase change materials. A first phase change material is deposited into an opening in a dielectric material layer and is coupled to a bottom electrode. The first phase change material is planarized to provide a phase change material storage location. A second phase change material is then deposited over the first phase change material. An electrode material is deposited over the second phase change material. The electrode material and the second phase change material are then etched to provide a phase change element.

As used herein, the term "electrically coupled" is not meant to mean that the elements must be directly coupled together and intervening elements may be provided between the "electrically coupled" elements.

Memory array 101 is electrically coupled to write circuit 124 through signal path 125, to controller 120 through signal path 121, and to sense circuit 126 through signal path 127. Controller 120 is electrically coupled to write circuit 124 through signal path 128 and to sense circuit 126 through signal path 10. Each phase change memory cell 104 is electrically coupled to a word line 110, a bit line 112, and a common or ground 114. Phase change memory cell 104a is electrically coupled to bit line 112a, word line 110a, and common or ground 114, and phase change memory cell 104b is electrically coupled to bit line 112a, word line 110b, and common or ground 114. Phase change memory cell 104c is electrically coupled to bit line 112b, word line 110a, and common or ground 114, and phase change memory cell 104d is electrically coupled to bit line 112b, word line 110b, and common or ground 114.

Each phase change memory cell 104 includes a phase change element 106 and a transistor 108. While transistor 108 is a field-effect transistor (FET) in the illustrated embodiment, in other embodiments, transistor 108 can be another suitable device such as a bipolar transistor or a 3D transistor structure. In other embodiments, a diode-like structure may be used in place of transistor 108. In this case, a diode and phase change element 106 is coupled in series between each cross point of word lines 110 and bit lines 112.

Phase change memory cell 104a includes phase change element 106a and transistor 108a. One side of phase change element 106a is electrically coupled to bit line 112a, and the other side of phase change element 106a is electrically coupled to one side of the source-drain path of transistor 108a. The other side of the source-drain path of transistor 108a is electrically coupled to common or ground 114. The gate of transistor 108a is electrically coupled to word line 110a.

Phase change memory cell 104b includes phase change element 106b and transistor 108b. One side of phase change element 106b is electrically coupled to bit line 112a, and the other side of phase change element 106b is electrically coupled to one side of the source-drain path of transistor 108b. The other side of the source-drain path of transistor 108b is electrically coupled to common or ground 114. The gate of transistor 108b is electrically coupled to word line 110b.

Phase change memory cell 104c includes phase change element 106c and transistor 108c. One side of phase change element 106c is electrically coupled to bit line 112b and the other side of phase change element 106c is electrically coupled to one side of the source-drain path of transistor 108c. The other side of the source-drain path of transistor 108c is electrically coupled to common or ground 114. The gate of transistor 108c is electrically coupled to word line 110a.

Phase change memory cell 104d includes phase change element 106d and transistor 108d. One side of phase change element 106d is electrically coupled to bit line 112b and the other side of phase change element 106d is electrically coupled to one side of the source-drain path of transistor 108d. The other side of the source-drain path of transistor 108d is electrically coupled to common or ground 114. The gate of transistor 108d is electrically coupled to word line 110b.

In another embodiment, each phase change element 106 is electrically coupled to a common or ground 114 and each transistor 108 is electrically coupled to a bit line 112. For example, for phase change memory cell 104a, one side of phase change element 106a is electrically coupled to common or ground 114. The other side of phase change element 106a is electrically coupled to one side of the source-drain path of transistor 108a. The other side of the source-drain path of transistor 108a is electrically coupled to bit line 112a.

Each phase change element 106 comprises a phase change material that may be made up of a variety of materials in accordance with the present invention. Generally, chalcogenide alloys that contain one or more elements from group VI of the periodic table are useful as such materials. In one embodiment, the phase change material of phase change element 106 is made up of a chalcogenide compound material, such as GeSbTe, SbTe, GeTe or AgInSbTe. In another embodiment, the phase change material is chalcogen free, such as GeSb, GaSb, InSb, or GeGaInSb. In other embodiments, the phase change material is made up of any suitable material including one or more of the elements Ge, Sb, Te, Ga, As, In, Se, and S.

Each phase change element 106 may be changed from an amorphous state to a crystalline state or from a crystalline state to an amorphous state under the influence of temperature change. The amount of crystalline material coexisting with amorphous material in the phase change material of one of the phase change elements 106a-106d thereby defines two or more states for storing data within memory device 100. In the amorphous state, a phase change material exhibits significantly higher resistivity than in the crystalline state. Therefore, the two or more states of phase change elements 106a-106d differ in their electrical resistivity. In one embodiment, the two or more states are two states and a binary system is used, wherein the two states are assigned bit values of "0" and "1". In another embodiment, the two or more states can be three states and a ternary system can be used, wherein the three states are assigned bit values of "038", "1", and "2". In another embodiment, the two or more states are four states that can be assigned multi-bit values, such as "00", "01", "10", and "11". In other embodiments, the two or more states can be any suitable number of states in the phase change material of a phase change element.

Controller 120 includes a microprocessor, microcontroller, or other suitable logic circuitry for controlling the operation of memory device 100. Controller 120 controls read and write operations of memory device 100 including the application of control and data signals to memory array 101 through write circuit 124 and sense circuit 126. In one embodiment, write circuit 124 provides voltage pulses through signal path 125 and bit lines 112 to memory cells 104 to program the memory cells. In other embodiments, write circuit 124 provides current pulses through signal path 125 and bit lines 112 to memory cells 104 to program the memory cells.

Sense circuit 126 reads each of the two or more states of memory cells 104 through bit lines 112 and signal path 127. In one embodiment, to read the resistance of one of the memory cells 104, sense circuit 126 provides current that flows through one of the memory cells 104. Sense circuit 126 then reads the voltage across that one of the memory cells 104. In another embodiment, sense circuit 126 provides voltage across one of the memory cells 104 and reads the current that flows through that one of the memory cells 104. In another embodiment, write circuit 124 provides voltage across one of the memory cells 104 and sense circuit 126 reads the current that flows through that one of the memory cells 104. In another embodiment, write circuit 124 provides current that flows through one of the memory cells 104 and sense circuit 126 reads the voltage across that one of the memory cells 104.

During a set operation of phase change memory cell 104a, one or more set current or voltage pulses are selectively enabled by write circuit 124 and sent through bit line 112a to phase change element 106a thereby heating phase change element 106a above its crystallization temperature (but usually below its melting temperature) with word line 110a selected to activate transistor 108a. In this way, phase change element 106a reaches its crystalline state or a partially crystalline and partially amorphous state during this set operation.

During a reset operation of phase change memory cell 104a, a reset current or voltage pulse is selectively enabled by write circuit 124 and sent through bit line 112a to phase change element 106a. The reset current or voltage quickly heats phase change element 106a above its melting temperature. After the current or voltage pulse is turned off, phase change element 106a quickly quench cools into the amorphous state or a partially amorphous and partially crystalline state. Phase change memory cells 104b-104d and other phase change memory cells 104 in memory array 101 are set and reset similarly to phase change memory cell 104a using a similar current or voltage pulse.

Figure 3A:
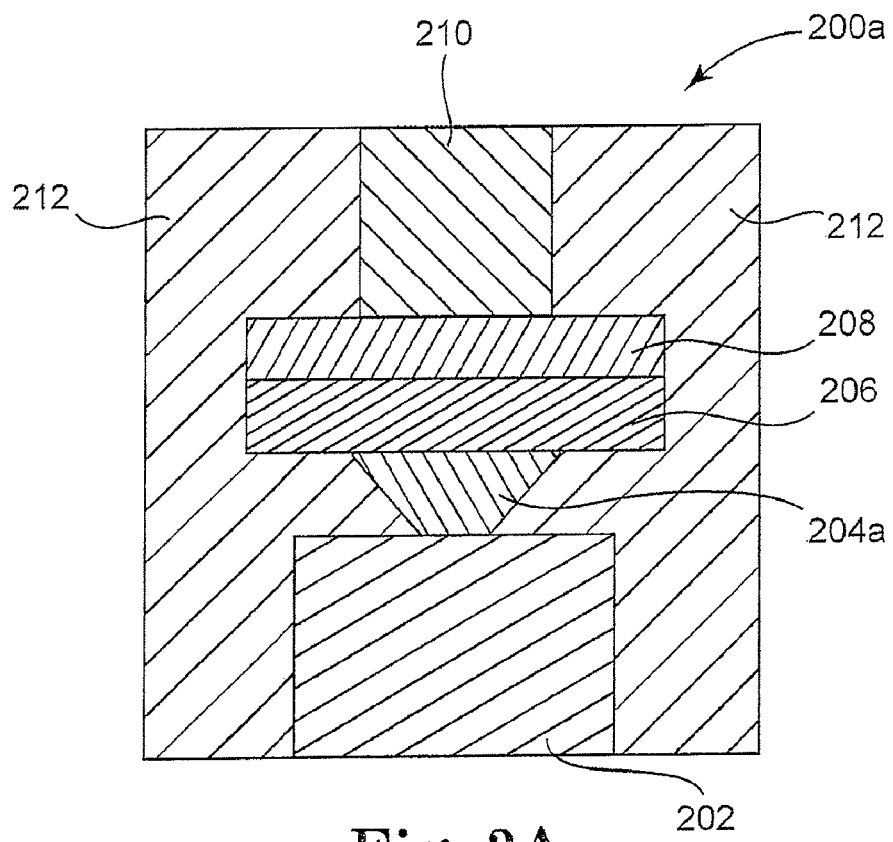
FIG. 3A illustrates a cross-sectional view of one embodiment of a phase change element.

FIG. 3A illustrates a cross-sectional view of one embodiment of a phase change element 200a. In one embodiment, each phase change element 106 is similar to phase change element 200a. Phase change element 200a includes a bottom electrode 202, a phase change material storage location 204a, a second phase change material 206, a top electrode 208, a contact 210, and dielectric material 212. In one embodiment, phase change material storage location 204a is a via or pore phase change material storage location.

Bottom electrode 202 includes TiN, TaN, W, Al, Ti, Ta, TiSiN, TaSiN, TiAlN, TaAlN, Cu, WN, C, or other suitable electrode material. The top of bottom electrode 202 contacts the bottom of phase change material storage location 204a. In one embodiment, phase change material storage location 204a has tapered sidewalls such that the cross-sectional width of the top of phase change material storage location 204a is greater than the cross-sectional width of the bottom of phase change material storage location 204a. Phase change material storage location 204a provides a storage location for storing one or more bits of data. The active or phase change region in phase change material storage location 204a is at or close to the interface between phase change material storage location 204a and bottom electrode 202.

The top of phase change material storage location 204a contacts the bottom of second phase change material 206. Second phase change material 206 includes a different phase change material than phase change material storage location 204a or a differently doped phase change material than phase change material storage location 204a. In one embodiment, second phase change material 206 has a lower thermal conductivity than phase change material storage location 204a. In one embodiment, phase change material storage location 204a is doped with N and second phase change material 206 is doped with SiN and/or $SiO_2$. In one embodiment, the cross-sectional width of second phase change material 206 is greater than the cross-sectional width of the top of phase change material storage location 204a.

The top of second phase change material 206 contacts the bottom of top electrode 208. Top electrode 208 includes TiN, TaN, W, Al, Ti, Ta, TiSiN, TaSiN, TiAlN, Cu, WN, C, or other suitable electrode material. In one embodiment, top electrode 208 has the same cross-sectional width as second phase change material 206. The top of top electrode 208 contacts the bottom of contact 210. Contact 210 includes TiN, TaN, TiSiN, TaSiN, TiAlN, WN, or other suitable contact material. In one embodiment, the cross-sectional width of contact 210 is less than the cross-sectional width of top electrode 208.

Bottom electrode 202, phase change material storage location 204a, second phase change material 206, top electrode 208, and contact 210 are laterally surrounded by dielectric material 212. Dielectric material 212 includes $SiO_2$, $SiO_x$, SiN, fluorinated silica glass (FSG), boro-phosphorous silicate glass (BPSG), boro-silicate glass (BSG), or other suitable dielectric material.

The current path through phase change element 200a is from contact 210 through top electrode 208, second phase change material 206, and phase change material storage location 204a to bottom electrode 202. In another embodiment, the current path is reversed. Second phase change material 206 reduces the heat loss in the upper direction from phase change material storage location 204a during programming, thus reducing the power used to program phase change material storage location 204a.

During operation, current or voltage pulses are applied between contact 210 and bottom electrode 202 to program phase change element 200a. During a set operation of phase change element 200a, a set current or voltage pulse is selectively enabled by write circuit 124 and sent through a bit line to contact 210. From contact 210, the set current or voltage pulse passes through top electrode 208, second phase change material 206, and phase change material storage location 204a to bottom electrode 202. The set current or voltage thereby heats the phase change material of phase change material storage location 204a above its crystallization temperature (but usually below its melting temperature). In this way, the phase change material reaches a crystalline state or a partially crystalline and partially amorphous state during the set operation.

During a reset operation of phase change element 200a, a reset current or voltage pulse is selectively enabled by write circuit 124 and sent through a bit line to contact 210. From contact 210, the reset current or voltage pulse passes through top electrode 208, second phase change material 206, and phase change material storage location 204a to bottom electrode 202. The reset current or voltage quickly heats the phase change material of phase change material storage location 204a above its melting temperature. After the current or voltage pulse is turned off, the phase change material quickly quench cools into an amorphous state or a partially amorphous and partially crystalline state.

Figure 3B:
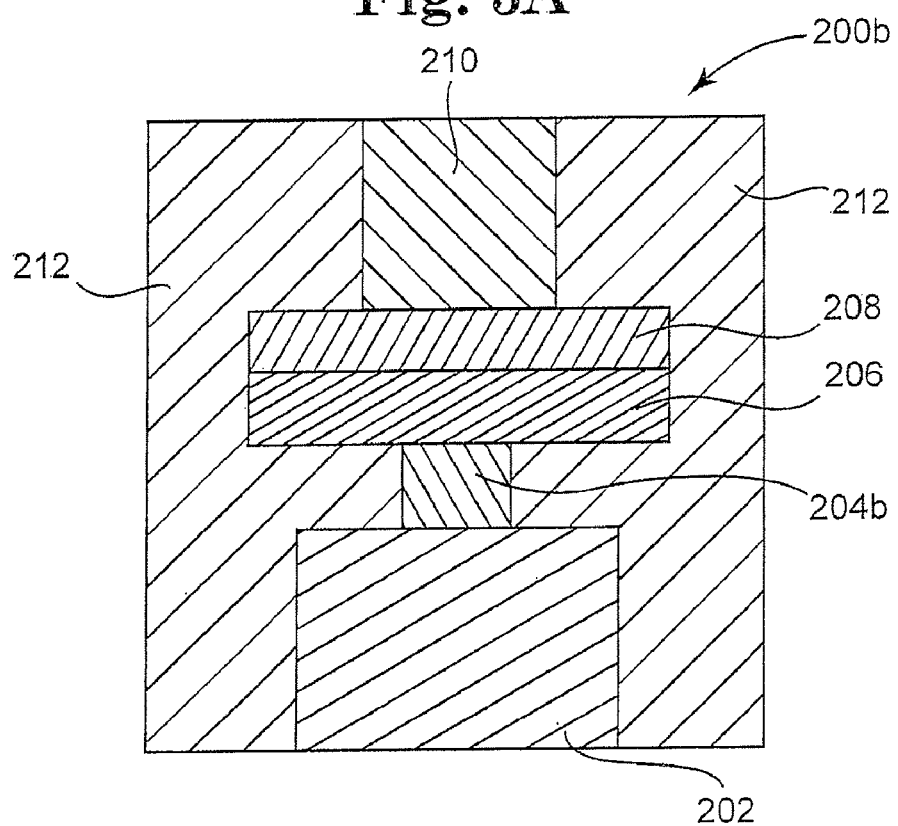
FIG. 3B illustrates a cross-sectional view of another embodiment of a phase change element.

FIG. 3B illustrates a cross-sectional view of another embodiment of a phase change element 200b. In one embodiment, each phase change element 106 is similar to phase change element 200b. Phase change element 200b is similar to phase change element 200a previously described and illustrated with reference to FIG. 3A, except that in phase change element 200b, phase change material storage location 204a is replaced with phase change material storage location 204b. In this embodiment, phase change material storage location 204b has parallel sidewalls. Phase change element 200b is programmed similarly to phase change element 200a previously described and illustrated with reference to FIG. 3A.

The following FIGS. 4-11 illustrate embodiments for fabricating phase change elements 200a and 200b previously described and illustrated with reference to FIGS. 3A and 3B.

Figure 4:
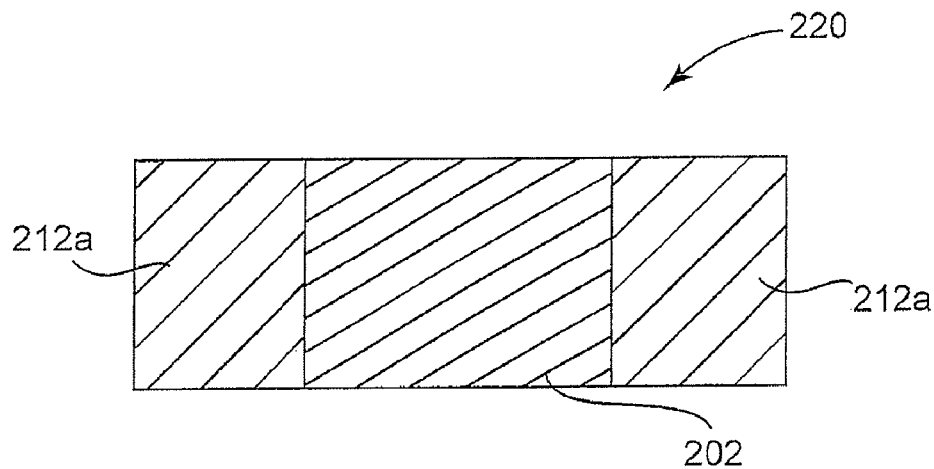
FIG. 4 illustrates a cross-sectional view of one embodiment of a preprocessed wafer.

FIG. 4 illustrates a cross-sectional view of one embodiment of a preprocessed wafer 220. Preprocessed wafer 220 includes bottom electrode 202, dielectric material 212a, and lower wafer layers (not shown). In one embodiment, the lower wafer layers include access devices, such as transistors or diodes, where each transistor or diode is electrically coupled to a bottom electrode 202. Bottom electrode 202 includes TiN, TaN, W, Al, Ti, Ta, TiSiN, TaSiN, TiAlN, TaAlN, Cu, WN, C, or other suitable electrode material. Bottom electrode 202 is laterally surrounded by dielectric material 212a. Dielectric material 212a includes $SiO_2$, $SiO_x$, SiN, FSG, BPSG, BSG, or other suitable dielectric material.

Figure 5:
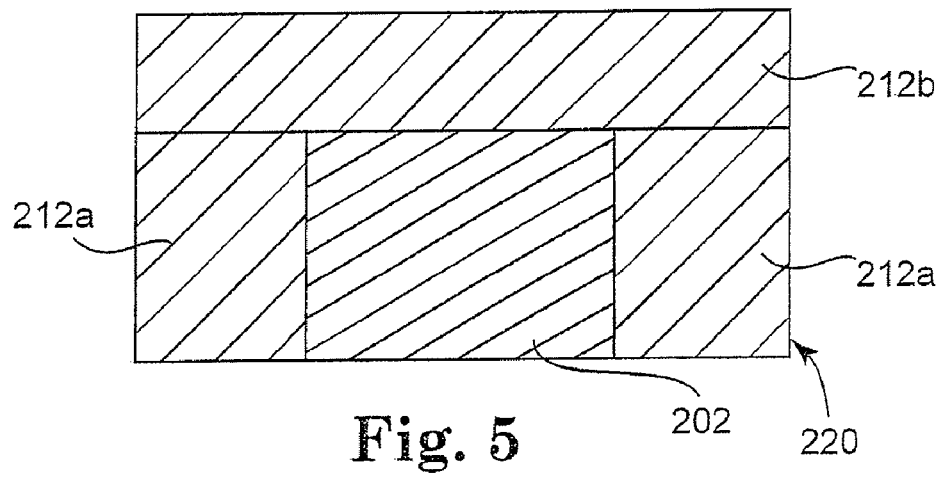
FIG. 5 illustrates a cross-sectional view of one embodiment of the preprocessed wafer and a dielectric material layer.

FIG. 5 illustrates a cross-sectional view of one embodiment of preprocessed wafer 220 and a dielectric material layer 212b. A dielectric material, such as $SiO_2$, $SiO_x$, SiN, FSG, BPSG, BSG, or other suitable dielectric material is deposited over preprocessed wafer 220 to provide dielectric material layer 212b. Dielectric material layer 212b is deposited using chemical vapor deposition (CVD), high density plasma-chemical vapor deposition (HDP-CVD), atomic layer deposition (ALD), metal organic chemical vapor deposition (MOCVD), physical vapor deposition (PVD), jet vapor deposition (JVD), spin on, or other suitable deposition technique.

Figure 6:
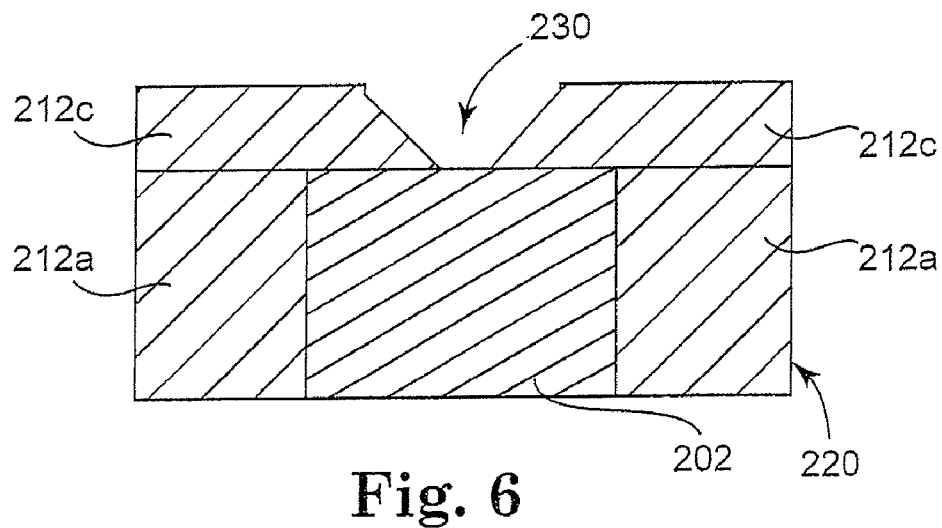
FIG. 6 illustrates a cross-sectional view of one embodiment of the preprocessed wafer and the dielectric material layer after etching the dielectric material layer.

FIG. 6 illustrates a cross-sectional view of one embodiment of preprocessed wafer 220 and dielectric material layer 212c after etching dielectric material layer 212b. Dielectric material layer 212b is etched to provide opening 230 having tapered sidewalls. Opening 230 exposes a portion of bottom electrode 202 to provide dielectric material layer 212c. In another embodiment, dielectric material layer 212b is etched to provide an opening having parallel sidewalls. In one embodiment, opening 230 is a via or pore exposing a portion of a single bottom electrode 202. In another embodiment, opening 230 is a trench exposing a portion of two or more bottom electrodes 202 along a row or column of memory array 101.

Figure 7:
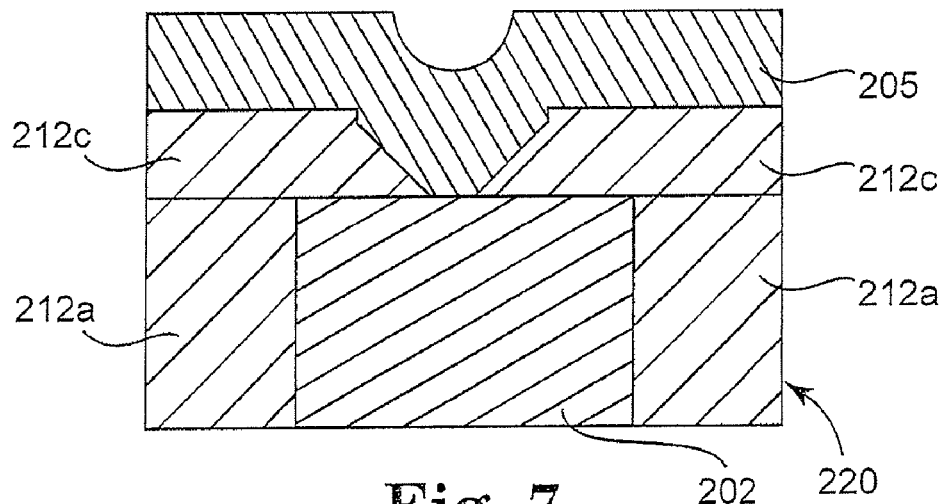
FIG. 7 illustrates a cross-sectional view of one embodiment of the preprocessed wafer, the dielectric material layer, and a first phase change material layer.

FIG. 7 illustrates a cross-sectional view of one embodiment of preprocessed wafer 220, dielectric material layer 212c, and a first phase change material layer 205. A phase change material, such as a chalcogenide compound material or other suitable phase change material is deposited over exposed portions of preprocessed wafer 220 and dielectric material layer 212c to provide first phase change material layer 205. First phase change material layer 205 is deposited using CVD, HDP-CVD, ALD, MOCVD, PVD, JVD, spin on, or other suitable deposition technique.

Figure 8:
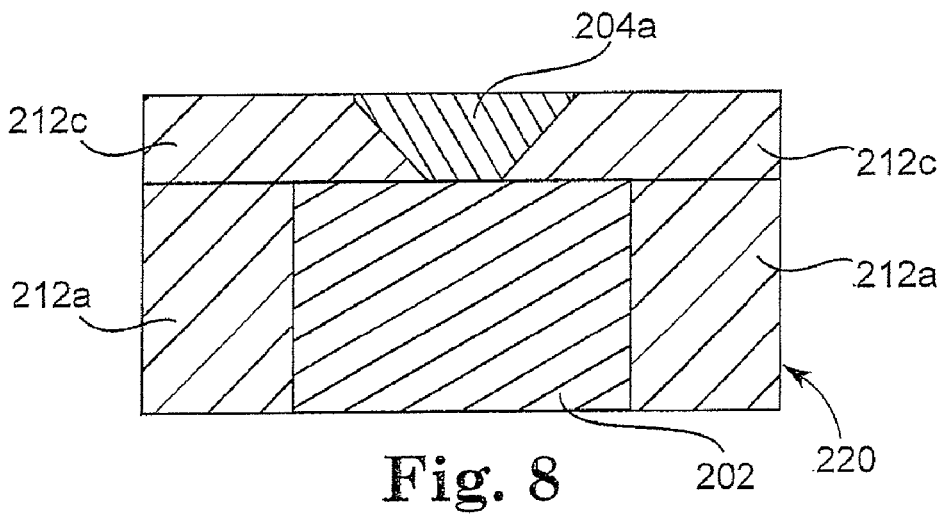
FIG. 8 illustrates a cross-sectional view of one embodiment of the preprocessed wafer, the dielectric material layer, and a phase change material storage location after planarization.

FIG. 8 illustrates a cross-sectional view of one embodiment of preprocessed wafer 220, dielectric material layer 212c, and phase change material storage location 204a after planarizing first phase change material layer 205. First phase change material layer 205 is planarized exposing dielectric material layer 212c to provide phase change material storage location 204a. First phase change material layer 205 is planarized using chemical mechanical planarization (CMP) or another suitable planarization technique.

Figure 9:
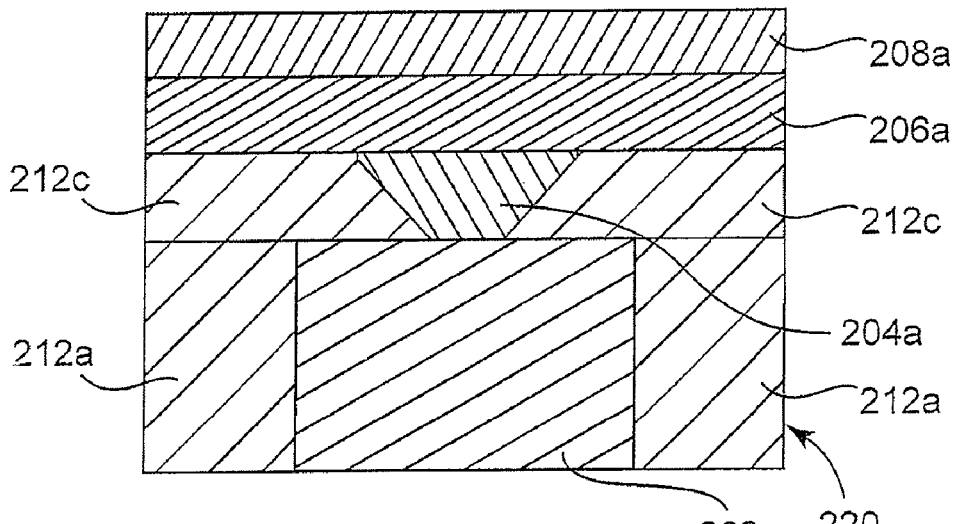
FIG. 9 illustrates a cross-sectional view of one embodiment of the preprocessed wafer, the dielectric material layer, the phase change material storage location, a second phase change material layer, and an electrode material layer.

FIG. 9 illustrates a cross-sectional view of one embodiment of preprocessed wafer 220, dielectric material layer 212c, phase change material storage location 204a, a second phase change material layer 206a, and an electrode material layer 208a. A phase change material, such as a chalcogenide compound material or other suitable phase change material is deposited over phase change material storage location 204a and dielectric material layer 212c to provide second phase change material layer 206a. Second phase change material layer 206a is deposited using CVD, HDP-CVD, ALD, MOCVD, PVD, JVD, or other suitable deposition technique.

An electrode material, such as TiN, TaN, W, Al, Ti, Ta, TiSiN, TaSiN, TiAlN, TaAlN, Cu, WN, C, or other suitable electrode material is deposited over second phase change material layer 206a to provide electrode material layer 208a. Electrode material layer 208a is deposited using CVD, HDP-CVD, ALD, MOCVD, PVD, JVD, or other suitable deposition technique.

Figure 10:
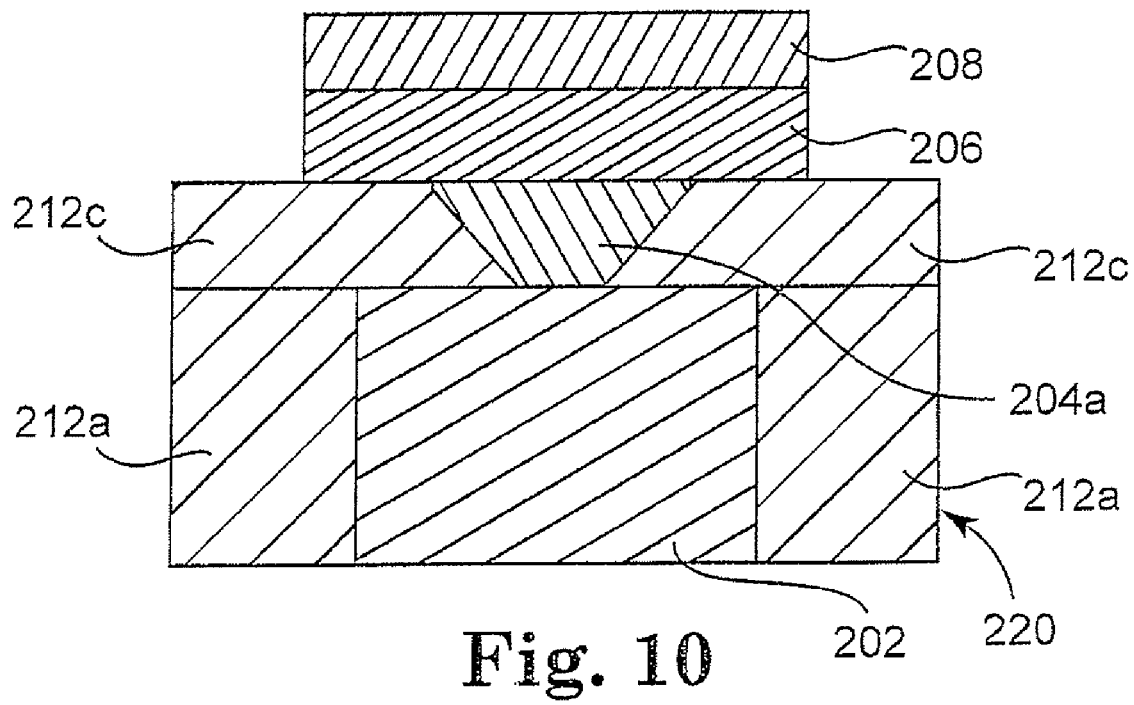
FIG. 10 illustrates a cross-sectional view of one embodiment of the preprocessed wafer, the dielectric material layer, the phase change material storage location, second phase change material, and a top electrode after etching.

FIG. 10 illustrates a cross-sectional view of one embodiment of preprocessed wafer 220, dielectric material layer 212c, phase change material storage location 204a, second phase change material 206, and a top electrode 208 after etching electrode material layer 208a and second phase change material layer 206a. Electrode material layer 208a and second phase change material layer 206a are etched exposing portions of dielectric material layer 212c to provide top electrode 208 and second phase change material 206. In one embodiment, top electrode 208 and second phase change material 206 are substantially centered over a single bottom electrode 202. In another embodiment, second phase change material 206 and top electrode 208 extend across two or more bottom electrodes 202 along a row or column of memory array 101.

Figure 11:
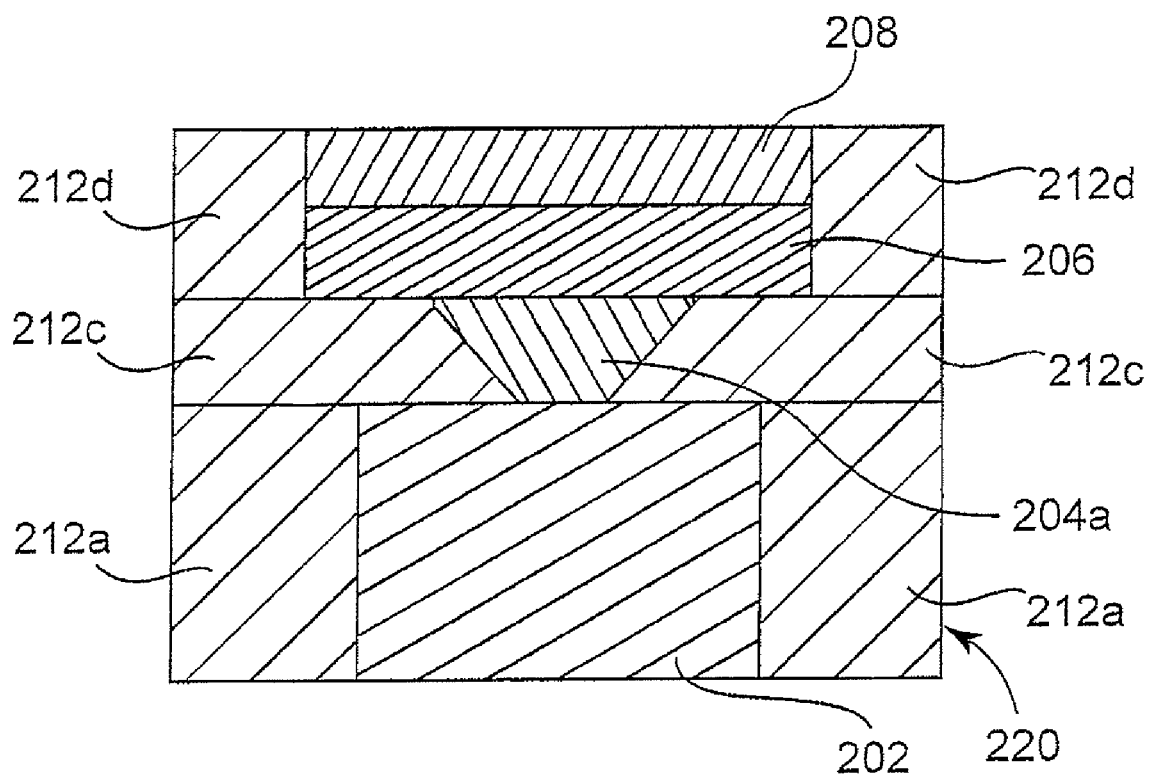
FIG. 11 illustrates a cross-sectional view of one embodiment of the preprocessed wafer, the dielectric material layer, the phase change material storage location, the second phase change material, the top electrode, and additional dielectric material.

FIG. 11 illustrates a cross-sectional view of one embodiment of preprocessed wafer 220, dielectric material layer 212c, phase change material storage location 204a, second phase change material 206, top electrode 208, and additional dielectric material 212d. A dielectric material, such as $SiO_2$, $SiO_x$, SiN, FSG, BPSG, BSG, or other suitable dielectric material is deposited over exposed portions of top electrode 208, second phase change material 206, and dielectric material 212c to provide an additional dielectric material layer. The additional dielectric material layer is deposited using CVD, HDP-CVD, ALD, MOCVD, PVD, JVD, or other suitable deposition technique. The additional dielectric material layer is then planarized exposing top electrode 208 to provide additional dielectric material 212d. The additional dielectric material layer is planarized using CMP or another suitable planarization technique.

Additional deposition and etching processes are then used to fabricate contact 210 of phase change element 200a as previously described and illustrated with reference to FIG. 3A. In another embodiment where opening 230 (FIG. 6) has parallel sidewalls, phase change element 200b as previously described and illustrated with reference to FIG. 3B is fabricated using similar fabrication processes as described with reference to FIGS. 7-11.

Embodiments provide a two layer phase change element having improved programming characteristics compared to typical phase change elements. The first phase change material is deposited in an opening formed in a dielectric material layer and has a planarized top surface. The second phase change material is deposited over the planarized top surface of the first phase change material. The second phase change material reduces the heat loss from the first phase change material during programming, thus reducing the power used to program the phase change element.

While the specific embodiments described herein substantially focused on using phase change memory elements, the present invention can be applied to any suitable type of resistive or resistivity changing memory elements.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for fabricating an integrated circuit, the method comprising:
   providing a preprocessed wafer including a first electrode;
   depositing a dielectric material over the preprocessed wafer;
   etching an opening in the dielectric material to expose a portion of the first electrode;
   depositing a first resistivity changing material over exposed portions of the etched dielectric material and the first electrode;
   planarizing the first resistivity changing material to expose the etched dielectric material;
   depositing a second resistivity changing material over the etched dielectric material and the planarized first resistivity changing material so that a top side of the planarized first resistivity changing material directly contacts a bottom side of the second resistivity changing material; and
   depositing an electrode material over the second resistivity changing material.

2. The method of claim 1, further comprising etching the electrode material and the second resistivity changing material to provide a second electrode and etched second resistivity changing material contacting the first resistivity changing material.

3. The method of claim 1, wherein etching the opening comprises etching a pore.

4. The method of claim 1, wherein etching the opening comprises etching a trench.

5. The method of claim 1, wherein etching the opening comprises etching an opening having tapered sidewalls.

6. The method of claim 1, wherein etching the opening comprises etching an opening having parallel sidewalls.

7. The method of claim 1, wherein depositing the first resistivity changing material comprises depositing a first phase change material, and wherein depositing the second resistivity changing material comprises depositing a second phase change material.

8. The method of claim 7, wherein the first and second phase change materials comprise different phase change materials.

9. The method of claim 7, wherein the second phase change material has a lower thermal conductivity than the first phase change material.

10. The method of claim 7, wherein the second phase change material is doped differently than the first phase change material.

11. The method of claim 10, comprising doping the first phase change material with N and the second phase change material with at least one of SiN and $SiO_2$.

12. A method for fabricating a memory, the method comprising:
   providing a preprocessed wafer including a first electrode;

providing dielectric material having a pore exposing a portion of the first electrode over the preprocessed wafer;

depositing a first phase change material over exposed portions of the dielectric material and the first electrode;

planarizing the first phase change material to expose the dielectric material;

depositing a second phase change material over the exposed dielectric material and the planarized first phase change material so that a top side of the planarized first phase change material directly contacts a bottom side of the second phase change material;

depositing an electrode material layer over the second phase change material; and etching the electrode material layer and the second phase change material to provide a second electrode and etched second phase change material contacting the planarized first phase change material.

* * * * *